United States Patent [19]

Dieterich

[11] Patent Number: 4,727,333

[45] Date of Patent: Feb. 23, 1988

[54] CIRCUITRY FOR MULTIPLYING A PCM SIGNAL BY A SINUSOID

[75] Inventor: Charles B. Dieterich, Kingston, N.J.

[73] Assignee: RCA Corporation, Princeton, N.J.

[21] Appl. No.: 879,979

[22] Filed: Jun. 30, 1986

[51] Int. Cl.$^4$ .................... H04L 27/06; H03D 1/00
[52] U.S. Cl. ........................... 329/50; 329/109;
328/160; 455/323; 455/337; 375/25; 375/94
[58] Field of Search .............. 329/50, 109, 110, 153,
329/154; 331/14, 17, 25, 32; 328/160; 375/24,
25, 94, 119, 120; 455/214, 323, 337

[56] References Cited

U.S. PATENT DOCUMENTS

| | | | |
|---|---|---|---|
| 4,404,430 | 9/1983 | Ogita | 179/1 |
| 4,517,655 | 5/1985 | Classen et al. | 364/703 |
| 4,569,072 | 2/1986 | van Roermund | 381/7 |
| 4,616,185 | 10/1986 | Van Roermund | 375/24 |
| 4,616,192 | 10/1986 | Van Roermund | 331/14 |

OTHER PUBLICATIONS van Ginderdeuren et al., "Compact NMOS Building Blocks and a Methodology for Dedicated Digital Filter Applications", IEEE, JSS6, vol. SC-18, No. 3, Jun. 83, pp. 306–315.

*Primary Examiner*—Eugene R. LaRoche
*Assistant Examiner*—David Mis
*Attorney, Agent, or Firm*—E. M. Whitacre; P. J. Rasmussen; E. P. Herrmann

[57] ABSTRACT

Apparatus for multiplying a sampled data signal by a sinusoid having a period which is a multiple of the sample rate includes a plurality of sample scaling means to scale the sampled data signal by factors corresponding to the sine of angle $\theta$ over an angular range of 90 degrees in angular increments of $2\pi$ divided by said multiple. A multiplexer multiplexes the scaled samples at the sample rate to produce a signal corresponding to the sampled data signal multiplied by the sinusoid. An embodiment is described for demodulating the stereo difference signal of a BTSC sound signal with serial-bit digital processing circuitry.

15 Claims, 5 Drawing Figures

CIRCUITRY FOR MULTIPLYING A PCM SIGNAL BY A SINUSOID

This invention relates to apparatus for multiplying sampled data signals by sinusoidal signals.

BACKGROUND OF THE INVENTION

Frequently it is desired in signal processing systems to multiply a signal by a sinusoid. A particular example of this is synchronous demodulation where an amplitude modulated carrier is multiplied by a reference signal corresponding to the carrier frequency in order to recover the modulating signal. To perform this operation on pulse code modulated (PCM) signals, heretofore it has been necessary to develop an analog reference signal, convert the reference signal to PCM format, and then multiply the PCM amplitude modulated carrier by the PCM reference signal. This apparatus requires at least an analog-to-digital converter and a PCM multiplier, both of which are relatively complex circuits.

Multiplication of analog sampled data signals is difficult for the reason that ideally linear analog multipliers are not practically available for consumer applications. For this reason multiplication of analog signals by a sinusoidal signal is approximated with a switching system which changes the polarity of the analog signal responsive to alternate half cycles of a square wave. This technique is generally acceptable for synchronous demodulation, however, it may introduce undesirable signal components in the demodulated signal if the signal being multiplied contains noise components at odd harmonics of the square wave frequency.

Minoru Ogita, in U.S. Pat. No. 4,404,430, disclosed apparatus which improved analog switching multipliers. The Ogita apparatus includes a voltage divider having an input terminal to which the signal to be multiplied is coupled and having a plurality of output taps from which successively attenuated signals are available. The output taps are applied to respective input terminals of a multiplexer. The attenuated signals are multiplexed to an output connection in a reciprocating manner which alternately scans through the attenuated signals in ascending order of attenuation for each first half cycle of the sinusoid and then in descending order of attenuation for alternate half cycles of the sinusoid. The accuracy of performance of this system according to Ogita increases with increasing numbers of output taps on the voltage divider.

It is an object of the present invention to provide parts efficient systems for multiplying sampled data signals by sinusoidal signals.

It is a further object of the present invention to provide a sinusoidal signal multiplying apparatus which produces products of high accuracy.

SUMMARY OF THE INVENTION

The present invention, for multiplying sampled data signals by a sinusoid includes apparatus for phase locking the rate of occurrence of the signal samples to be multiplied to the sinusoid. The samples are coupled to a plurality of scaling circuits arranged to scale the samples by coefficients corresponding to the sine or cosine of angular arguments in increments of $2\pi/N$ where N is a positive integer equal to the ratio of the period of the sinusoidal signal to the period of the sample rate of the signal being multiplied. Multiplexing means operating synchronously with the sample rate sequentially outputs the scaled samples in an order to effect multiplication by a sinusoid.

In a further embodiment of the invention the same set of scaled samples are multiplexed in different sequences to provide multiplication by both a sinusoidal and a cosinusoidal signal.

In a still further embodiment of the invention, the same set of scaled samples are multiplexed in different sequences to provide output signals corresponding to the input samples multiplied by sinusoidal signals of frequency $\omega$ and twice $\omega$.

A still further embodiment includes integrating circuitry coupled to the multiplexing means to provide a time averaged phase error signal for synchronizing the sample rate to the sinusoid. The signal provided by the integrating circuit is coupled to the control input of a voltage controlled oscillator supplying the sampling signal.

DETAILED DESCRIPTION

Figure 1:
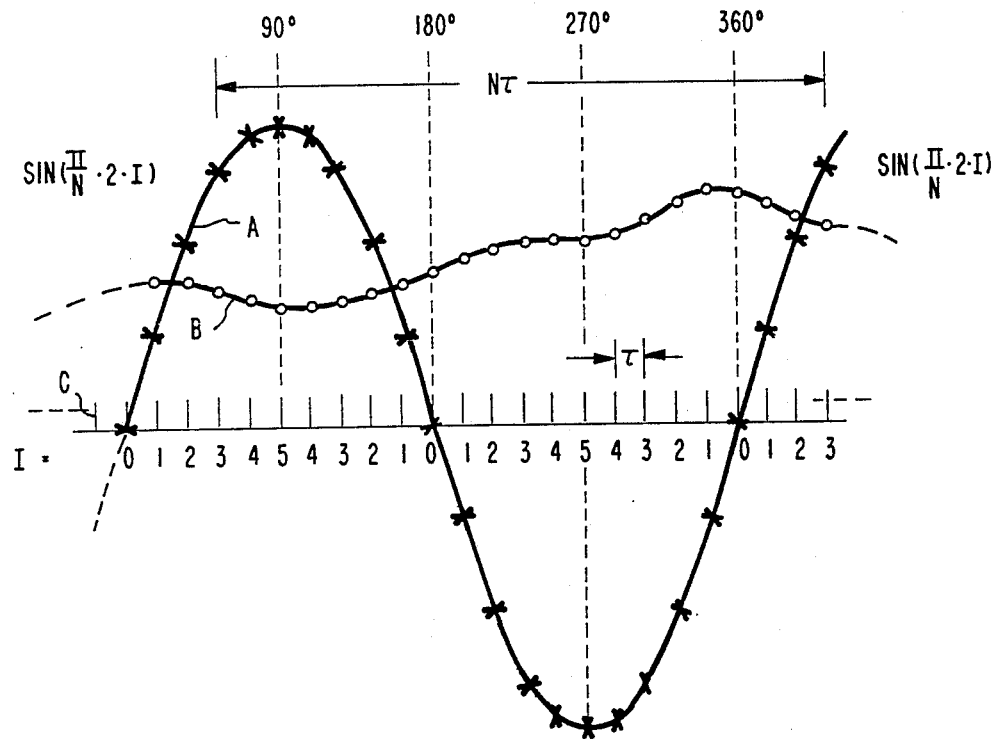
FIG. 1 is a waveform drawing helpful in understanding the invention.

FIG. 1 illustrates an arbitrary signal (waveform B) which is to be multiplied by a sinusoid (waveform A). The waveforms are illustrated in continuous analog form but the multiplication is to be performed on discrete samples. Waveform C represents a sample rate clock with the tic marks representing points in time at which the analog signals are represented by corresponding discrete samples. The x's and zeroes on waveforms A and B respectively represent the amplitudes of the samples.

The sinusoid A has a constant amplitude and is assumed to be phase locked to the sample clock. The period of sinusoid A is N times the period of the sample clock C. Therefore, the values of every Nth sample of the sinusoidal signal are the same. Consequently every Nth sample of the waveform B will be multiplied by the same value. The samples represented by waveform B are multiplied (scaled) by a maximum of N values representing the sinusoid. The two half cycles of the sinusoid are symmetric in that the magnitudes of the corresponding consecutive values representing the two half cycles are the same. Thus, the number of scale factors required to represent the sinusoid is actually N/2 if provision is made to effect a change of polarity. Further, if the number N is even, there is symmetry about quarter cycles of the sinusoid, further reducing the number of magnitude values required to represent the sinusoid to $(N/4+1)$.

In FIG. 1, N is equal to 20. The values of the magnitudes of the scale factors required to represent the sinusoid may be represented by the expression $\sin(2I\pi/N)$ where I is an index equal to 0, 1, 2 ... N/4. For N equal to 20, the index I goes from zero to 5.

Multiplication of waveform B by a sinusoid as represented by waveform A is performed as follows. The sequence of signal samples representing waveform B are sequentially applied to N/4+1 scaling circuits which respectively scale the samples by sin ((2Iπ/N), I=0 to 5. The scaled samples are multiplexed at the sample rate according to the sequence of index values 0, 1, 2, 3, 4, 5, 4, 3, 2, 1, 0, 1, 2, etc. The output of the multiplexer is applied to circuitry for selectively inverting the polarity of applied signals. Alternate sets of ten consecutive scaled samples between the zero valued indicies have their polarities reversed.

Alternatively, if it is desired to multiply by a cosinusoidal signal the scaled samples are multiplexed according to the sequence of index values 5, 4, 3, 2, 1, 0, 1, 2, 3, 4, 5, 4, 3, 2, 1, 0, 1, 2, 3, 4 and alternate sets of ten consecutive scaled samples between index values of zero have their polarities reversed.

For a system where the period of the sinusoid is an odd multiple N of sample periods, $(N-1)/2+1$ scaling circuits are required and the index value I equal 0, 1 . . . $(N-1)/2$. The scaled output samples are multiplexed according to the index sequence 0, 1, 2, 3 . . . $((N-1)/2-1)$, $(N-1)/2$, $(N-1)/2$, $((N-1)/2-1)$ . . . 3, 2, 1, 0, 1, 2 . . . In this instance, to multiply by a sinusoidal signal, polarity reversal is performed on alternate sets of $((N-1)/2+1)$ consecutive scaled samples between index values zero and $(N-1)/2$. This implementation is constrained to the 180° coefficient symmetry rather than the 90° coefficient symmetry where N is even.

It should be appreciated that the technique set forth provides multiplication of an arbitrary sampled data signal by a sinusoidal signal without the necessity of actually generating a sinusoidal signal.

The following discussion is in terms of PCM digital systems, however, similar systems may readily be realized for sampled data analog signals.

Figure 2:
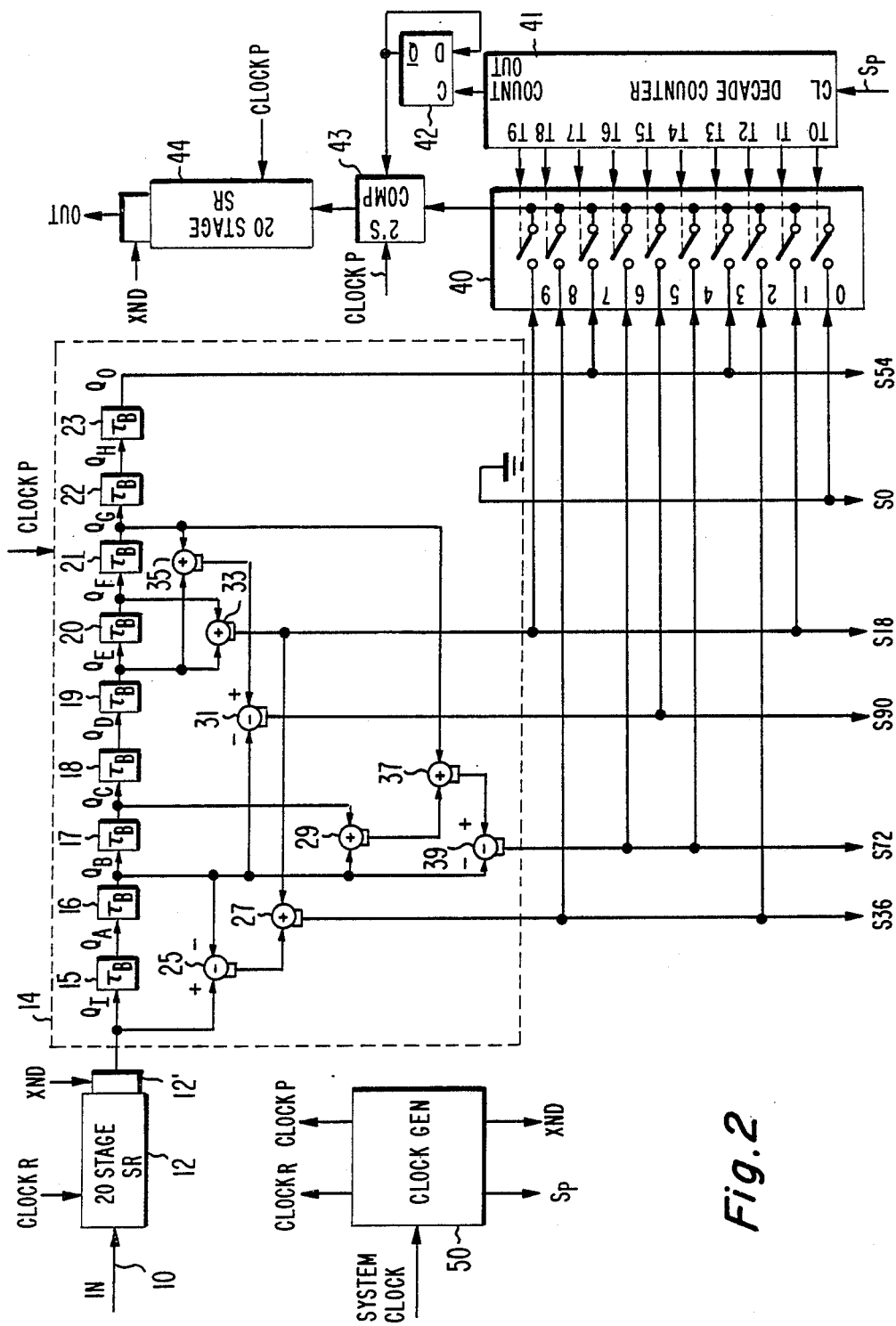
FIG. 2 is a block diagram of a serial-bit multiplier embodying the invention.

FIG. 2 illustrates exemplary circuitry for multiplying a serial-bit PCM signal by a sinusoidal signal having a period N=20 times the period of the sample rate of the PCM signal. The input samples are assumed to be 20-bit samples in two's complement format with the least significant bit (LSB) of respective samples occurring first in time and the most significant bit (MSB) being a sign bit. In order to avoid using true multiplier circuits, a system of bit-shifting-and-adding is employed to scale samples. Those persons skilled in the art of serial-bit digital processing will appreciate that advancing or delaying a serial-bit signal respectively effects a division or multiplication of the sample by $2^n$ where n is the number of bit positions the sample is advanced or delayed relative to the applied sample. Scaling is performed by providing relatively advanced and delayed replicas of the sample and summing and/or differencing the appropriate sample and advanced/delayed replicas to produce the desired scaled sample.

Figure 3:
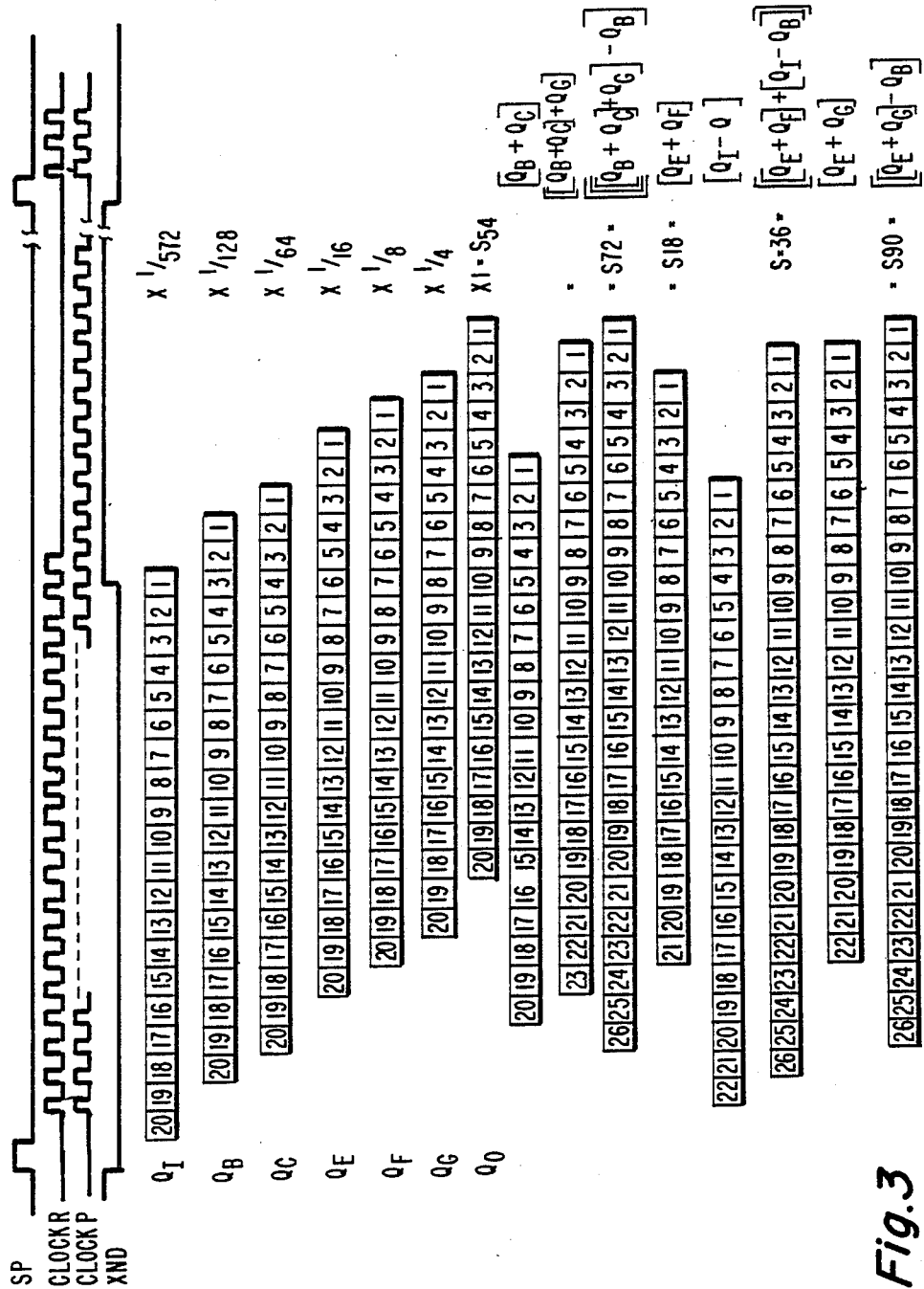
FIG. 3 is a waveform drawing useful in describing the operation of the FIG. 2 multiplier.

The FIG. 2 apparatus will be described with reference to the waveforms and bit-patterns illustrated in FIG. 3. In FIG. 2 the samples to be multiplied by a sinusoid are applied at connection 10 to the 20-stage serial-bit register 12. At the beginning of each sample period defined by the sample pulse $S_p$ the register 12 contains a 20-bit sample. Register 12 is clocked by clock R, which provides 20 clock pulses per sample period, to output the sample LSB first and MSB last to scaling circuit 14. Register 12 includes an output latch 12' which is controlled by the signal XND to latch and replicate the MSB (sign-bit) for the duration of the sample period.

Scaling circuit 14 includes cascaded delay stages 15-23 which are clocked synchronously at the sample bit rate and each of which provides a one sample bit delay period. The serial sample bit stream from register 12 is coupled to the delay stages 15-23 each of which provides a sample replica successively delayed by one bit period. In this embodiment the delayed replica, represented by $Q_o$, provided by delay stage 23, is utilized as the reference sample or sample datum. $Q_o$, utilized as the reference sample, is effectively scaled by the factor "1", and the remaining scaled samples are referenced to this sample. Selecting $Q_o$ as the reference provides two advantages. The first is that there are nine available replicas advanced in time by consecutive bit periods relative to $Q_o$. These replicas are representations of the sample at $Q_o$ scaled by the values ½, ¼, ⅛, 1/16, 1/32, 1/64, 1/128, 1/256 and 1/512. Secondly, it facilitates generating scale factors which are relatively close approximations to sin(2Iπ/N) for N=20 with a minimum of add/subtract circuits.

For N even and equal to 20, the scale factors are symmetric about 90 degrees. The magnitudes of the scale factors correspond to the sines of the arguments of 0°, 18°, 36°, 54°, 72° and 90°. It has been found that by normalizing the scale factors to sin 54°, very simple sums of binary submultiples closely approximate the actual trigonometric ratios. In other words, rather than establishing the scale factors as the values of sin (2Iπ/N), the scale factors have been established according to sin(2Iπ/N)/sin(54°). This expands the normal range of 0 to 1 for the scale factors representing the sines of 0° to 90°, to scale factors having the range of 0 to 1.2361. If it is of consequence to the operation of the system in which the multiplier apparatus of FIG. 2 is implemented, the output samples from the multiplier can be subsequently normalized to samples-multiplied by a unit sinusoid by scaling the output samples by the magnitude of sin(54°) or 0.8090 decimal or by prescaling the input signal to the scaling circuitry by the same factor. Table I lists the indicies I, the argument $\theta=(2I\pi/N)$ the normalized scale factors sin $\theta$/sin 54, the binary estimate of the scale factors developed by scaling circuit 14 and the percent error between the binary estimates and the actual scale factor.

TABLE I

| I | $\theta$ | sin $\theta$/sin 54 | binary estimate | 0/0 error |
|---|---|---|---|---|
| 0 | 0 | 0 | 0 | 0.00 |
| 1 | 18 | 0.3820 | 0.3750 | 2.07 |
| 2 | 36 | 0.7265 | 0.7266 | 0.01 |
| 3 | 54 | 1.0000 | 1.0000 | 0.00 |
| 4 | 72 | 1.1756 | 1.1718 | 0.32 |
| 5 | 90 | 1.2361 | 1.2343 | 0.15 |

Referring again to FIGS. 2 and 3, the bit pattern output from register 12 is illustrated as $Q_I$ and is coincident in time with the burst of bit-rate pulses of clock R. The sample represented by $Q_I$ is delayed nine bit-periods by delay elements 15-23 and is output from delay element 23 as the delayed replica $Q_o$. In addition, replicas of $Q_I$ delayed by 2, 3, 5, 6 and 7 bit periods from delay elements 16, 17, 19, 20 and 21 are represented $Q_B$, $Q_C$, $Q_E$, $Q_F$ and $Q_G$ respectively. Since $Q_o$ has been specified as the reference sample $Q_G$, $Q_F$, $Q_E$, $Q_C$, $Q_B$ and $Q_I$ all occur advanced in time relative to $Q_o$. Thus, at any instant in time the samples $Q_G$, $Q_F$, $Q_E$, $Q_C$, $Q_B$ and $Q_I$ correspond to sample $Q_o$ divided by 4, 8, 16, 64 128 and 512 respectively. In FIG. 3, for a given sample period, all of the bit pattern values (ones and zeroes) of samples $Q_I$ to $Q_o$ are the same but relatively displaced in time. The sums of samples illustrated below the samples $Q_I$ to $Q_o$, however, contain different values and different numbers of bits. The numbers in the bit patterns of the sums, therefore, only serve to indicate the number of the respective bits in the respective sums.

The normalized scale factors are derived as follows. The scale factor, $S_o$, corresponding to 0° is simply zero or logic zero potential. The scale factor, $S_{54}$ corresponding to the sine of 54° to which all the scale factors are normalized is one, that is, the sample $Q_o$ is taken as it occurs. The desired scale factor, $S_{18}$, corresponding to the normalized sine of 18° is 0.3820. This value is approximated by combining the sample $Q_E$ which corresponds to 1/16 the reference sample value, with the sample $Q_F$ which corresponds to ⅛ the reference sample value in adder circuitry 33. Adder circuit 33 (and the remaining adder and subtracter circuits illustrated in FIG. 2) require one bit period to perform the addition. The contributions to the sum are therefore effectively multiplied by a factor of two relative to the sample datum. Adder 33 produces the value $2(Q_E+Q_F)$ which corresponds to 2/16 times the current sample value plus 2/8 times the current sample value or 0.3750 times the current sample value. Note, in FIG. 3 each set of square brackets about a sum designates that the sum has been delayed in its generation by one bit period, consequently, each square bracket indicates that the bracketed sum is to be multiplied by two for each bracket.

The normalized scale factor for the normalized sine of 36° ($S_{36}$) from Table I, is 0.7265. Scale factor $S_{36}$ is approximated by adding the sum provided by adder 33 to the difference $2(Q_I-Q_B)$ and multiplying this sum by the factor two. Sample $Q_B$ is subtracted from sample $Q_I$ in subtracter 25. This difference is multiplied by two by virtue of the one bit delay of the subtracter. The difference from subtracter 25 and the sum from adder 33 are summed in adder 27 which also inherently provides a multiplication by two. The value output by adder 27 corresponds to $$S_{36} = 2[Q_I - Q_B] + 2[Q_E + Q_F]] \quad (1)$$

$$= 2[2[1/512 - 1/128] + 2[1/16 - 1/8]] \times \text{current sample} \quad (2)$$

$$= 0.7266 \times \text{current sample}. \quad (3)$$

The scale factor, $S_{72}$, corresponding to the normalized sine of 72° is similarly formed by adding $Q_B$ and $Q_C$ in adder 29, adding this sum to $Q_G$ in adder 37 and then subtracting $Q_B$ from the total sum in subtracter 39. The inherent delays in the three level adder/subtracter tree result in $$S_{72} = 2[2[2[Q_B + Q_C] + Q_G] - Q_B] \quad (4)$$

$$= 2[2[2[1/128 + 1/64] + 1/4] - 1/128] \times \text{current sample} \quad (5)$$

$$= 1.1718 \times \text{current sample}. \quad (6)$$

The scaled output samples $S_0$, $S_{18}$, $S_{36}$, $S_{54}$, $S_{72}$, $S_{90}$ from scaling circuit 14 are coupled to respective input connections of 10-to-1 multiplexer 40. Output $S_0$ is coupled to multiplexer switch 0. Output $S_{18}$ is coupled to multiplexer switches 1 and 9. Output $S_{36}$ is coupled to multiplexer switches 2 and 8. Output $S_{54}$ is coupled to multiplexer switch 3 and 7. Output $S_{72}$ is coupled to multiplexer switches 4 and 6, and output $S_{90}$ is coupled to multiplexer switch 5.

The switches of multiplexer 40 are selectively controlled by the decade counter 41, which is clocked at the sample rate by signal $S_P$, to successively couple the scaled sample values to the two's complement circuitry 43. One scaled sample is coupled to circuitry 43 per sample period. To effect a multiplication by a sinusoid the decade counter is arranged to sequentially exclusively close switches 0–9 in ascending order and successively repeat this operation. The output of multiplexer 40, for each sequence of 0–9 switch closures, corresponds to the applied PCM samples being multiplied by the positive half of a sine wave, since all of the scaling circuits produce positive valued scale factors. The two's complement circuit 43 is coupled to the output connection of multiplexer 40 to perform a polarity reversal on alternate half cycles of the sinusoidally scaled samples. That is for alternate sequences of switch closures 0–9, two's complement circuit 43 is conditioned to pass samples coupled to its input connection, unaltered. During intervening sequences of switch closures 0–9, the two's complement circuit 43 is conditioned to complement or reverse the polarity of the samples coupled to its input. If the decade counter 41 is realized with a type CD4017 decade counter available from RCA Corporation, Somerville, N.J., the two's complement circuitry may be controlled by the carry-out signal from the counter. The carry-out signal has a positive going transition coincident with the first of the count output signals $T_0$–$T_9$. The carry-out is applied to a positive edge triggered flip-flop 42 arranged as a divide-by-two frequency divider. Flip-flop 42 so arranged produces a logic high level for alternate series of counter output signals $T_0$–$T_9$ and a logic low level for intervening series of counter output signals $T_0$–$T_9$ as required to effect the desired polarity reversal.

In the system illustrated, it is assumed that the two's complement circuitry includes a two-bit-period delay. The total bit delay incurred by the MSB from register 12 to the output of the two's complement circuit 43 is therefore 31 bit rate clock pulses. In addition, different ones of the scaled samples have different numbers of bits. In order to normalize the scaled samples, that is to properly justify them in bit-size and time, the samples from two's complement circuitry 43 are applied to a 20 stage register 44. Register 44, two's complement circuitry 43 and scaling circuit 14 are all clocked with a bit-rate clock having bursts of 31 pulses per sample period and designated as clock P in FIGS. 2 and 3. Clocking the scaled samples, which have undergone fewer delays than the datum samples $Q_0$, into register 44, with clock P, establishes the position of the bits of these samples relative to the datum to maintain the effect of scaling. In this process excess lesser significant bits of the scaled samples are dropped off the end of register 44.

Clock generator 50 provides the requisite clock and control signals from a system clock. The clock signals may easily be generated from the waveforms of FIG. 3 by one skilled in the art of signal processing so element 50 will not be described in detail.

The system of FIG. 2 may be arranged to multiply the input signal by a cosinusoidal waveform by rearranging the multiplexer connections to multiply the scaled samples in the order $S_{90}$, $S_{72}$, $S_{54}$, $S_{36}$, $S_{18}$, $S_0$, $S_{18}$, $S_{36}$, $S_{54}$, $S_{72}$, $S_{90}$, $S_{72}$, $S_{54}$, $S_{36}$, $S_{18}$, $S_0$, $S_{18}$, $S_{36}$, $S_{54}$, $S_{72}$, $S_{90}$, etc. and complementing the scaled samples between alternate occurrences of scaled samples $S_0$. Further, if the accuracy of the LSB of the output signal from the polarity reversing circuitry 43 is not critical, polarity reversal may be performed by a 1's complement circuit consisting of an exclusive OR gate with one input terminal coupled to the output of multiplexer 40 and a second input coupled to the flip-flop 42.

It is instructive to note at this point that the product of the signal times the sinusoid is dependent on the coefficient accuracy of the scaling circuits, and completely independent of the number of scaling circuits provided the sample rate of the signal to be multiplied is phase locked to the sinusoid.

Figure 4:
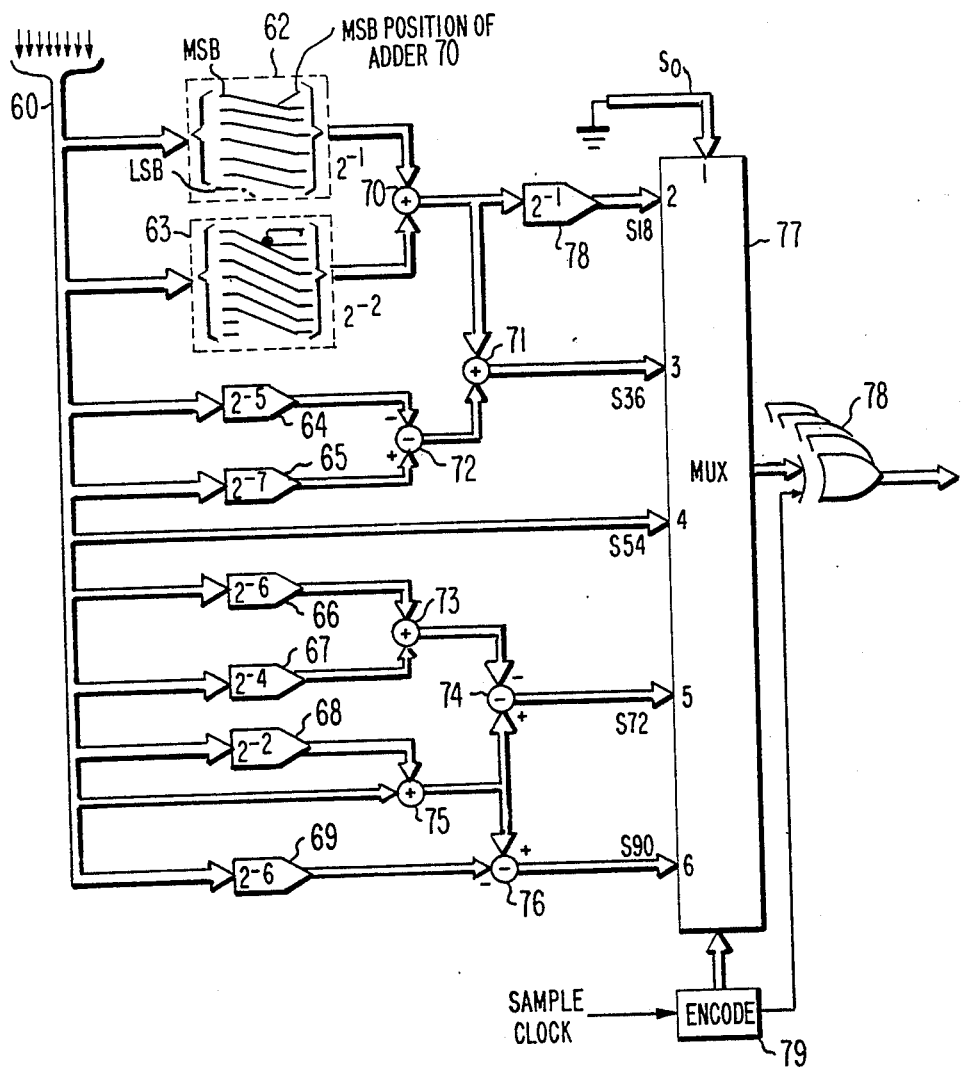
FIG. 4 is a block diagram of a parallel bit multiplier embodying the invention.

FIG. 4 illustrates a parallel-bit system for multiplying a parallel-bit signal by a sinusoidal signal. Parallel-bit signals may be scaled by integral powers of two by shifting the bit significance of the parallel-bit samples relative to the input sample. That is, if the bit significance of each bit of a parallel-bit sample is shifted n significant positions to lesser or greater significant bit positions, the bit shifted sample corresponds to the original sample divided or multiplied by $2^n$ respectively. This type of bit shifting (i.e. scaling) may be accomplished by simple wiring arrangements. An example of a hard wired bit shifting scaling circuit is illustrated by elements 62 and 63 in FIG. 4. Element 62 is a wiring arrangement which shifts the bits of the input samples on bus 60 to one bit position of lesser significance as input to adder 70. The MSB or sign bit is replicated in the vacant MSB input position of the adder to accommodate two's complement samples. Note in circuit 62 the LSB of the input sample is not utilized but dropped. Element 62 performs a scaling of the input sample by ½. Scaling element 63 shifts the bits of the input samples to two bit positions of lesser significance to effect scaling by ¼. In this circuit the two lesser significant bits of the input sample are dropped and the MSB of the input sample is replicated in the two vacant most significant bit positions of the second input of adder 70.

Scaling circuits 64-69 are similar wiring arrangements to circuits 62 and 63 and, thus, may be realized without actual circuit hardware except for wiring interconnects between bus 62 and the respective adder or subtracter circuits.

The multiplier circuitry of FIG. 4 is arranged to multiply samples applied on bus 60 by a sinusoid normalized to 54 degrees. For simplicity of description, the sinusoid is assumed to have a period which is 20 times the sample period. Normalization to 54 degrees is performed to minimize the amount of adders/subtracters required to generate the requisite scaled samples. The scaled signals $S_0$–$S_{90}$ generated by the FIG. 4 circuitry thus correspond to the values listed in Table I.

In parallel-bit shift-and-add scalers, sample bit timing is not important and the system is conceptually simpler than the serial-bit systems. Since the parallel-bit multiplier is normalized to the sine of 54°, the scaled sample $S_{54}$ corresponds to the input samples on bus 60, which samples are applied directly as samples $S_{54}$ to one input of multiplexer 77. The scaled samples, $S_0$ corresponding to samples multiplied by sin(0) are zero valued, so logic zero valued (ground) signals are applied as samples $S_0$ to a second input of multiplexer 77. Scaled samples $S_{18}$ corresponding to samples multiplied by sin(18)/sin(54) are approximated by scaling input samples from bus 60 by ½ in element 62 and by ¼ in element 63 and summing these scaled samples in adder 70 to produce values equal to (½+¼) times the current sample or 0.75 times the current sample. The sums provided by adder 70 are scaled by ½ in element 78 (which may be similar to element 62) to develop samples $S_{18}$ equal to 0.3750 times the current sample. The samples $S_{18}$ are coupled to a third input to multiplexer 77.

Samples $S_{36}$ corresponding to the input samples multiplied by sin(36)/sin(54) are approximated by scaling the input samples, from bus 60, by 1/32 and 1/128 in elements 64 and 65 respectively and subtracting the scaled sample developed by element 64 from the scaled sample developed by element 65 in subtracter 72 to produce the values (1/128−1/32) times the current sample. Samples from subtracter 72 are summed with samples from adder 70 in adder 71 to develop the samples $S_{36}$ given by $$S_{36} = [(1/128 - 1/32) + (1/2 + 1/4)] \times \text{current sample} \quad (7)$$

$$= 0.7265 \times \text{current sample}. \quad (8)$$

The samples $S_{36}$ from adder 71 are coupled to a fourth input of multiplexer 77. The scaled samples $S_{72}$ and $S_{90}$ corresponding to samples multiplied by sin(72)/sin(54) and sin(90)/sin(54) respectively are similarly developed by the illustrated circuitry and coupled to fifth and sixth inputs to multiplexer 77.

Multiplexer 77 is a 6-to-1 multiplexer rather than a 10-to-1 multiplexer as illustrated in FIG. 2 because each one of the inputs of the multiplexer 77 is a parallel-bit port having plural connections. As such, the number of multiplexing switches is large and cumbersome. Since multiplexer 77 includes but one input port for each of the scaled signals, to develop an output signal corresponding to the input samples multiplied by a sinusoid, the inputs are sequentially coupled to the output port alternately in ascending order and descending order. The control signal to accomplish multiplexing is developed by the encoder 79 which is responsive to the sample clock. Encoder 79 may be an up/down counter arranged to count up from 0 to 5, then count down from 5 to 0, then count up from 0–5 and so forth.

The output of multiplexer 77 corresponds to the input samples multiplied by the magnitude of a sinusoid. This signal is coupled to a complementing circuit 78, comprised of a bank of two input exclusive OR gates (XOR), which is controlled by encoder 79 to reverse the polarity of alternate sets of ten output samples to produce an output signal corresponding to the input samples multiplied by a sinusoid. Each of the bank of XOR gates has one input terminal connected to the encoder 79 and respective second input terminals coupled to one of the parallel output bit connections from multiplexer 77.

Figure 5:
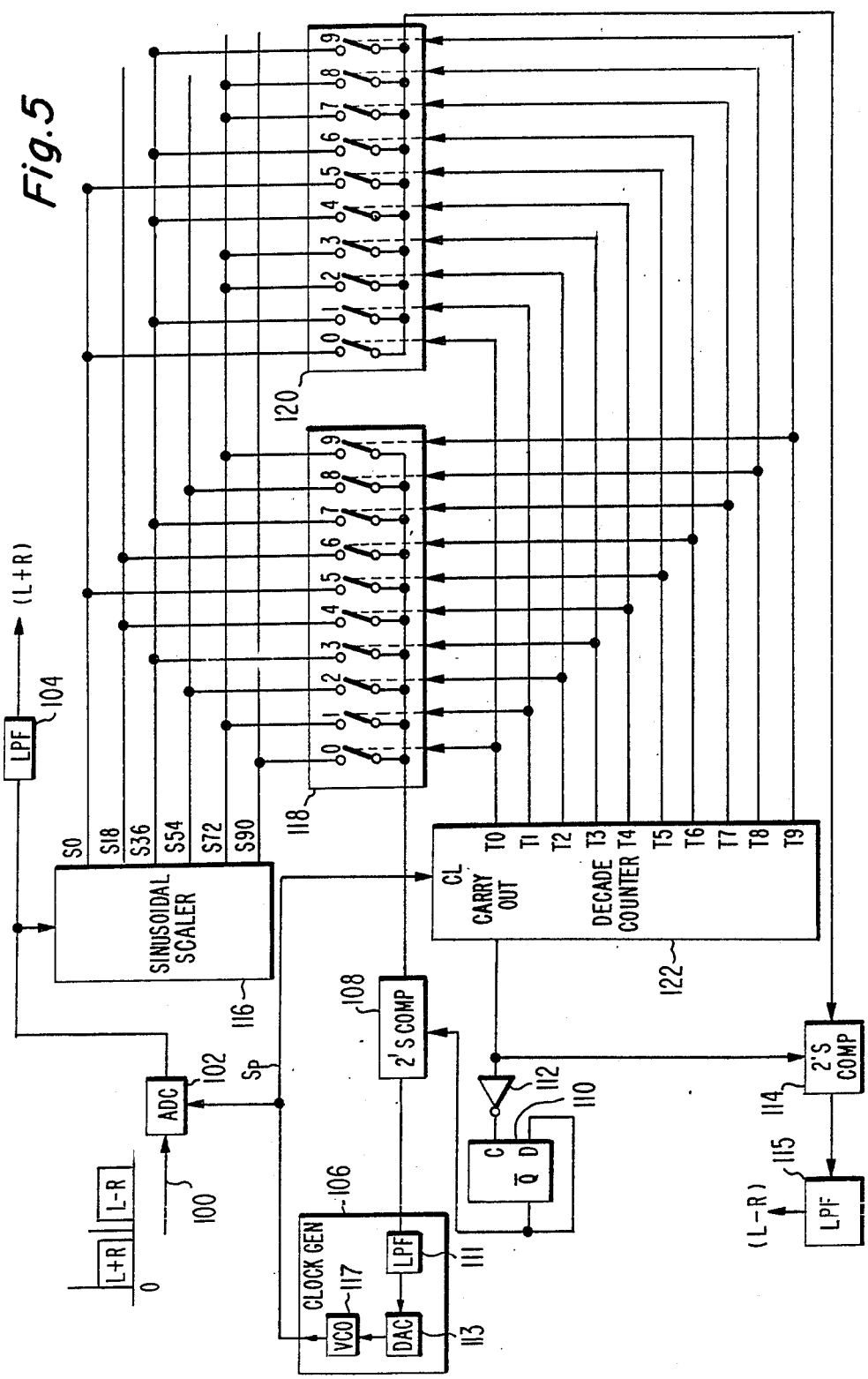
FIG. 5 is a block diagram of a serial-bit audio processing system incorporating the invention to effect separation of components of a composite audio signal.

FIG. 5 illustrates serial-bit audio processing circuitry utilizing the apparatus of the present invention to demodulate the difference channel signal (L−R) of a BTSC (stereo TV) sound signal. Baseband composite sound signal, from, for example, a television tuner, is applied on connection 100. The composite sound signal includes a baseband sum (L+R) or monophonic signal having a bandwidth from approximately 50 to 15,000 Hz, a pilot signal of 15,734 Hz and a difference (L−R) or stereo component which is a double side band amplitude modulated suppressed carrier signal centered about twice the pilot frequency.

The composite sound signal, C(t), may be represented mathematically $$C(t) = S(t) + P\sin(\omega t) + D(t)\sin 2\omega t \quad (9)$$

where S(t) corresponds to the (L+R) component, P is the magnitude of the pilot and ω the radian frequency of the pilot, and D(t) corresponds to the (L−R) modulating difference component.

The composite sound signal is coupled to the analog input terminal of an analog-to-digital converter (ADC) 102. ADC 102 samples the input signal at a rate of twenty times the pilot frequency and produces serial-bit PCM samples representing the composite sound signal. The output samples from ADC 102 are coupled to a serial-bit digital low-pass filter 104 which produces a separated monophonic (L+R) PCM signal to the exclusion of the other components of the composite sound signal.

The serial-bit output samples from ADC 102 are also coupled to the sinusoidal scaling circuit 116 which may be similar to elements 12, 14 and 50 of FIG. 2. Scaling circuit 116 develops a plurality of signals $S_0$–$S_{90}$ corresponding to the serial-bit PCM composite sound signal samples scaled by, for example, $\sin(2I\pi/N)/\sin(54°)$ where I is equal to 0, 1, 2 ... N/4 and N is equal to 20. The scaled samples are coupled to respective input terminals 0–9 of a first multiplexer 118. The scaled samples are coupled: $S_{90}$ to input terminal 0; $S_{72}$ to input terminals 1 and 9; $S_{54}$ to input terminals 2 and 8; $S_{36}$ to input terminals 3 and 7; $S_{18}$ to input terminals 4 and 6; and $S_0$ to input terminal 5. The input terminals of multiplexer 118 are reciprocally successively exclusively coupled in the order 0–9 at the sample rate to its output terminal to develop a signal corresponding to the input PCM samples multiplied by the magnitudes of cos(ωt) where ω corresponds to the pilot signal frequency. The output samples from multiplexer 118 are applied to a polarity reversing circuit which reverses the polarity of alternate sequences of ten samples to produce a signal corresponding to the input samples multiplied by cos(ωt). The switches 0–9 of multiplexer 118 are closed, responsive to control signals $T_0$–$T_9$ from decade counter 122, to produce the sequence of scaled samples $S_{90}$, $S_{72}$, $S_{54}$, $S_{36}$, $S_{18}$, $S_0$, $S_{18}$, $S_{36}$, $S_{54}$, $S_{72}$, etc. The polarity reversal should begin at scaled sample $S_0$ corresponding to 0. This coincides with control signal $T_5$ from decade counter 122. Coincident with the start of $T_5$ the carry-out signal of the decade counter 122 (CD4017) undergoes a negative transition. This transition is inverted by inverter 112 and utilized to trigger the D-type flip-flop 110 which is interconnected as a frequency divider. Responsive to the carry-out signal flip-flop 110 provides a square wave having a logic one state for 10 sample pulse periods beginning at alternate occurrences of control signal $T_5$, and having a logic zero state for 10 sample pulse periods beginning at the intervening occurrence of signal $T_5$. The square wave produced by flip-flop 110 is applied to control the polarity reversing circuit 10B.

The output O(t) from the polarity reversing circuit 108 corresponds to C(t) times G cos(ωt) where G is equal to 1/sin(54°). Thus $$O(t) = S(t)G\cos(\omega t) + PG\sin(\omega t)\cos(\omega t) + D(t)G\sin(2\omega t)\cos(\omega t). \quad (10)$$

This signal is coupled to the clock generator circuit 106 which generates the sample clock. In the clock generator circuit, the signal O(t) is applied to a low-pass filter in element 111 where it is integrated over a relatively long interval compared to a period of the pilot signal, and utilized as a phase error signal. This integrated signal is converted to an analog voltage in digital-to-analog converter 113 and applied to the control input of the voltage controlled oscillator VCO 117. The VCO 117 generates the sampling clock signal. If the sampling clock is properly phase locked to the pilot signal, the signal O(t) is as described in the equation (10). Since each term in equation (10) is a sinusoid, the integration of O(t) produces a zero valued error signal indicating phase lock. Conversely, if the sample clock is not phase locked to the pilot signal, the argument of the cosine terms (the effective radian frequency of the synthesized sinusoid) will not coincide with the arguments of the sine terms. The first and third terms of O(t) will be sinusoids and integrate to zero in circuitry 106 but the middle term of equation for (10) will contain a D.C. term as well as a sinusoid, the latter of which will integrate to zero. Let the middle term equal PG sin(ωt)·cos(ω+Δ) where Δ is the phase error between the pilot signal and the generated cosine used to multiply the input signal. Using trigonometric identities the term PG sin(ωt)·cos(ωt+Δ) can be shown to be equal to PG[sin(2ωt+Δ)+sin Δ]/2. When this term is integrated it produces a phase error signal proportional to (PG sin Δ)/2. This non zero phase error signal conditions the VCO 117 to increase or decrease in frequency to effect phase locking of the sampling clock with the pilot signal.

Selected ones of the scaled samples from the sinusoidal scaling circuit 116 are coupled to a second multiplexer 120 similar to multiplexer 118 and controlled by decade counter 122. The scaled samples coupled respectively to the switches 0–9 of multiplexer 120 are $S_0$, $S_{36}$, $S_{72}$, $S_{36}$, $S_0$, $S_{36}$, $S_{72}$, $S_{72}$, $S_{36}$. This sequence of scaled samples is coupled to the output of multiplexer 120 at the sample rate to effect a multiplication of the input samples representing C(t) by a sinusoid of twice the pilot frequency, i.e. sin(2ωt). The output of multiplexer 120 is coupled to the polarity reversing circuit 114 which reverses the polarity of the scaled samples coupled to the output of multiplexer 120 via switches 5–9. Polarity reversing circuit 114 is controlled directly by the carry-out signal from the decade counter 122. The carry-out signal is a logic high for output pulses from counter connections $T_0$ to $T_4$, and a logic low for output pulses from connections $T_5$ to $T_9$. Polarity reversing circuit 114 passes samples unaltered for a logic high control signal and complements applied samples for a logic low control signal.

The output signal $O_P(t)$ from polarity reversing circuit 114 corresponds to C(t)·sin(2ωt) which when expanded may be represented $$O_P(t) = [S(t)\sin(2\omega t) + P(\cos(\omega t) - \cos(3\omega t))/2 + D(t)(1-\cos(4\omega t))/2]G. \quad (11)$$

where G is equal to the reciprocal of the sin(54°). Signal $O_P(t)$ from circuit 114 is applied to the low-pass filter 115 which separates the baseband component GD(t)/2 corresponding to the (L−R) signal from the modulated terms of $O_P(t)$.

The processing circuitry of FIG. 5 is particularly parts efficient since both a cosine of one frequency and a sine of twice this frequency are generated using one multiplexer decoder (element 122) and four scaling circuits (within element 116) to generate the sinusoidally scaled samples. This minimum hardware advantageously provides both synchronous detection of the (L−R) difference signal and the error signal for phase locking the sampling clock.

What is claimed is:

1. Apparatus for multiplying sampled data signals, including a component having a predetermined frequency, by a sinusoid, comprising:
    a terminal for applying said sampled data signal;
    a plurality of scaling circuits respectively coupled to said terminal, for providing a plurality of signals representing said sampled data signal scaled by factors corresponding substantially to trigonometric ratios representing one of the sines and cosines of angular increments between 0 degrees and at least 90 degrees; and
    multiplexing means coupled to said plurality of scaling circuits for sequentially applying said plurality of signals to an output terminal in an order to produce an output signal corresponding to said sampled data signal multiplied by a sinusoid; and
    means coupled to said multiplexing means, and responsive to said output signal, for phase locking said sinusoid to said component having a predetermined frequency.

2. The apparatus set forth in claim 1 wherein said sampled data signal is a serial-bit PCM digital signal and said plurality of scaling circuits include:
    delay means having an input coupled to said terminal and having a plurality of output terminals at which replicas of said PCM digital signal delayed by incremental sample bit periods are avaialble; and
    a plurality of sample combining means for combining respective ones of said replicas to produce samples representing said PCM digital signals scaled by approximations to said trigonometric ratios.

3. The apparatus set forth in claim 1 wherein said scale factors are all positive valued and said multiplexing means includes a signal polarity reversing circuit for reversing the polarity of ones of the sequentially applied signals over periods of half cycles of said sinusoid.

4. Apparatus for processing sampled data signals, including a sinusoidal component, comprising:
    means for applying said sampled data signal;
    a plurality of scaling means coupled to said means for applying said sampled data signal, for providing a plurality of samples corresponding to said sampled data signals respectively substantially scaled by sinusoidal trigonometric ratios of angles in increments of $2\pi/N$ where N is an integer equal to the ratio of the period of said sinusoidal component to the period of the rate of occurrence of said sampled data signal;
    multiplexing means coupled to said plurality of scaling means for selectively applying, at said sample rate, said scaled signals to an output terminal in a sequence to produce a signal corresponding to said sampled data signals multiplied by a sinusoid; and
    means coupled to the output terminal of said multiplexing means for phase locking the rate of sample occurrence of said sampled data signal to said sinusoidal component.

5. The apparatus set forth in claim 4 wherein said multiplexing means includes polarity reversing circuitry for selectively reversing the polarity of samples of said signal applied to said output terminal over alternate half periods of said sinusoid.

6. The apparatus set forth in claim 5 wherein said multiplexing means includes means for selectively applying, at said sample rate, ones of said scaled signals to a further output terminal, in a sequence to produce a further signal corresponding to said sampled data signals multiplied by a sinusoid having a period K times the reciprocal of said sample rate, where K is one of a multiple and submultiple of N.

7. The apparatus set forth in claim 6 wherein said multiplexing means includes further polarity reversing circuitry for selectively reversing the polarity of samples of said further signal over alternate half periods of said sinusoid having a period K times the reciprocal of said sample rate.

8. The apparatus set forth in claim 6 wherein said means for phase locking the sample rate to said sinusoid comprises:
    a source of analog signal;
    sampling means having an input coupled to said source, having a sampling clock input terminal and having an output coupled to said scaling means;
    a controlled oscillator having an output coupled to said sampling clock input terminal and having a control input terminal;
    signal averaging means having an output coupled to the control input terminal of said controlled oscillator and having an input terminal coupled to said multiplexing means.

9. The apparatus set forth in claim 8 wherein said sampling means includes an analog-to-digital converter for providing PCM representations of said samples.

10. Apparatus for digitally processing a signal including a pilot component, said apparatus comprising:
    an input terminal for applying said signal;
    means, having a control input terminal, for providing a sampling signal at a predetermined rate;
    an analog-to-digital converter coupled to said input terminal and responsive to said sampling signal for providing PCM samples at said predetermined rate and corresponding to said signal;
    a plurality of scaling means coupled to said analog-to-digital converter, for providing a plurality of samples corresponding to said PCM samples respectively scaled by factors substantially corresponding to sinusoidal trigonometric ratios of angles in increments of $2\pi/N$, where N is an integer;
    multiplexing means, coupled to said plurality of scaling means, for selectively applying at said predetermined rate, said scaled samples to a first output terminal in a sequence to produce a signal corresponding to said PCM samples mulitplied by a sinusoid having a period N times the reciprocal of said predetermined rate; and
    means coupled to said first output terminal and said control input terminal for synchronizing said sampling signal to said pilot component.

11. The apparatus set forth in claim 10 wherein said multiplexing means includes a polarity reversing circuit for selectively reversing the polarity of samples of said first signal over alternate half periods of said sinusoid.

12. The apparatus set forth in claim 11 wherein said means coupled between said first output terminal and said control input terminal includes sample averaging means responsive to said first signal from said multiplexing means.

13. The apparatus set forth in claim 12 wherein said multiplexing means further includes means for selectively applying, at said predetermined rate, ones of said scaled samples to a second output terminal, in a sequence to produce a second signal corresponding to said PCM samples multiplied by a sinusoid having a period N/2 times the reciprocal of said predetermined rate.

14. The apparatus set forth in claim 13 wherein said multiplexing means includes further polarity reversing circuitry for selectively reversing the polarity of samples of said second output signal over alternate half periods of said sinusoid having a period N/2 times the reciprocal of said predetermined rate.

15. Apparatus for processing sampled data signals, including a sinusoidal component, comprising:

means for applying said sampled data signal;

a plurality of scaling means coupled to said means for applying sampled data signal, for providing a plurality of samples corresponding to said sampled data signals respectively substantially scaled by sinusoidal trigonometric ratios of angles in increments of $2\pi/N$ where N is an integer equal to the ratio of the period of said sinusoidal component to the period of the rate of occurrence of said sampled data signal;

multiplexing means coupled to said plurality of scaling means for selectively applying, at said sample rate, said scaled signals to an output terminal in a sequence to produce a signal corresponding to said sampled data signals multiplied by a sinusoid; and means coupled to the output terminal of said multiplexing means for phase locking said sinusoidal component to said sinusoid.

* * * * *